United States Patent [19]
Brooks

[11] 4,209,216
[45] Jun. 24, 1980

[54] SOCKET INSERTION GUIDE

[75] Inventor: Ray G. Brooks, Irving, Tex.

[73] Assignee: Convey, Inc., Irving, Tex.

[21] Appl. No.: 948,526

[22] Filed: Oct. 4, 1978

[51] Int. Cl.² ............................................. H01R 13/62
[52] U.S. Cl. ........................................ 339/65; 29/741
[58] Field of Search ...................... 339/17 CF, 65, 66; 29/741, 758

[56]  References Cited
U.S. PATENT DOCUMENTS

| | | | |
|---|---|---|---|
| 3,441,853 | 4/1969 | Bodine | 339/17 CF |
| 3,538,580 | 11/1970 | Bruner | 29/741 |
| 3,892,312 | 7/1975 | Tems | 339/17 CF |
| 3,896,533 | 7/1975 | Ullman et al. | 29/741 |

Primary Examiner—Joseph H. McGlynn
Attorney, Agent, or Firm—W. Thomas Timmons

[57] ABSTRACT

A socket insertion guide for an encapsulated electronics package having pins oriented to be inserted into socket contacts in substantially a single direction is disclosed. The socket insertion guide includes a pair of longitudinal placement guides and a pair of lateral placement guides. The guides extend beyond the distal ends of the pins and guide the movement of the encapsulated electronics package toward the socket so that the pins are inserted into the socket contacts. The guide also includes a means for orienting the proximal ends of the pins for proper insertion of the distal ends of the pins into the socket contacts. An arrangement of the socket insertion guide for dual in-line packages includes a housing with walls for the sides and ends of the package, the walls extending from beyond the distal ends of the pins in one direction to beyond the dual in-line package body in the other direction, where the inner faces of the walls serve to align the pins of the dual in-line package with the socket contacts when the housing is placed over the socket. A stop extending from the inside face of each end wall fixes the position of the dual in-line package. The socket insertion guide also includes a channel for placement in the housing over the top of the dual in-line package, aligning the proximal ends of the pins on each side of the dual in-line package.

5 Claims, 3 Drawing Figures

SOCKET INSERTION GUIDE

BACKGROUND OF THE INVENTION

1. Field of the Invention

The present invention relates generally to packaging for electronic devices and in one of its aspects to a device to aid in inserting encapsulated electronics packages into sockets.

2. Description of the Prior Art

Many electronics circuits such as amplifier stage circuits, memory circuits, and others, are available in encapsulated electronics packages having bodies that contain the circuitry and pins made of electrically conducting material to electrically connect the circuitry to other electronic circuitry. Normally, such an encapsulated electronics package is connected into a socket, its pins inserted into the socket contacts. Difficulties are frequently encountered in plugging an encapsulated electronics packgage into a socket. A very common encapsulated electronics package known as a dual in-line package or DIP causes special problems since it has two rows of flat pins extending outwardly from its sides and then bent in the direction of insertion. In a DIP having eight pins per side, a person must simultaneously insert 16 pins into 16 contacts in order to insert the DIP into a socket. A commonly used technique for inserting a DIP into a socket is to hold the DIP by the ends of the DIP body between the thumb and pointer finger, rest the tips of the pins of one row in their respective row of contacts and then begin turning the second row of pins toward its row of contacts while exerting pressure against the first row, bending the pins of the first row slightly. Since the pins of the DIP are flat, however, they are frequently bent or crimped, making it necessary to then try to straighten the pins out before reattempting to insert the DIP into the socket. After a pin has been bent a few times, the DIP becomes useless since it is no longer possible to insert it into the socket. People who spend a great deal of time working with electronics end up wasting much of that time in trying to insert such encapsulated electronics packages or trying to straighten out pins that have resulted from faulty insertions. Additionally, the pins are often damaged in attempting to remove the DIP from the socket.

Besides the difficulty of inserting and removing such encapsulated electronics packages into sockets, the exposed pins of encapsulated electronics packages that are not currently plugged in regularly get bent from handling, from having other items set on them, and from other causes.

SUMMARY OF THE INVENTION

The present invention concerns a socket insertion guide for an encapsulated electronics package having pins oriented to be inserted into socket contacts in substantially a single direction. A pair of longitudinal placement guides, one longitudinal placement guide for each end of the encapsulated electronics package, extend beyond the distal ends of the pins. The distance between the insides of the longitudinal placement guides is sufficient to allow the length of the socket to be inserted therebetween, but not substantially greater than the length of the socket plus the socket length dimension of a contact minus the socket length dimension of a pin. Similarly, a pair of lateral placement guides, one lateral placement guide for each side of the encapsulated electronics package, extends beyond the distal ends of the pins. The distance between the insides of the lateral placement guides is sufficient to allow the width of the socket to be inserted therebetween and not substantially greater than the width of the socket plus the socket width dimension of a contact minus the socket width dimension of a pin. A preferred arrangement of the socket insertion guide also includes a means for orienting the proximal ends of the pins for proper insertion of the distal ends of the pins into the socket contacts. The terms "longitudinal" and "lateral" are used here to denote two directions on a plane substantially perpendicular to the direction of insertion and not necessarily to indicate that one side is longer than the other nor that the cross-sectional shape of the socket and socket insertion guide is necessarily rectangular.

An embodiment of the socket insertion guide especially useful for dual in-line packages includes a housing for retaining the dual in-line package and receiving the socket in an insertion relationship to the dual in-line package. The housing has two side walls and two end walls which in this case are also the lateral placement guides and the longitudinal placement guides respectively since all extend from beyond the distal ends of the pins of the dual in-line package in one direction to beyond the dual in-line package body in the other direction. The two side walls and two end walls align the pins of the dual in-line package with the socket contacts when the socket is received into the housing. A pair of stops is also included in the socket insertion guide, one stop extending from the inside face of each end wall for fixing the position of the dual in-line package with respect to the housing in the direction of insertion of the pins into the socket contacts. An interference fit exists between the ends of the dual in-line package body and the end walls. A preferred arrangement of the DIP socket insertion guide includes a channel for placement in the housing, having a web and flanges, the web fitting over the top of the DIP, and the flanges forming an interference fit with the side walls, each flange extending across the proximal ends of the pins on one side of the DIP. The flanges extending across the proximal ends of the pins aligns the proximal ends of the pins on each side of the DIP, orienting the proximal ends of the pins for proper insertion of the distal ends of the pins into the socket contacts.

Sockets are often equipped with a beveled or "keyed" edge to indicate which is the proper orientation for inserting the encapsulated electronics package. One embodiment of the present invention includes a mating surface for the beveled or "keyed" edge to ensure that the package can only be inserted in the proper orientation.

These and other objects, advantages and features of this invention will be apparent from the following description taken with reference to the accompanying drawings, wherein is shown the preferred embodiments of the invention.

DETAILED DESCRIPTION

Figure 1:
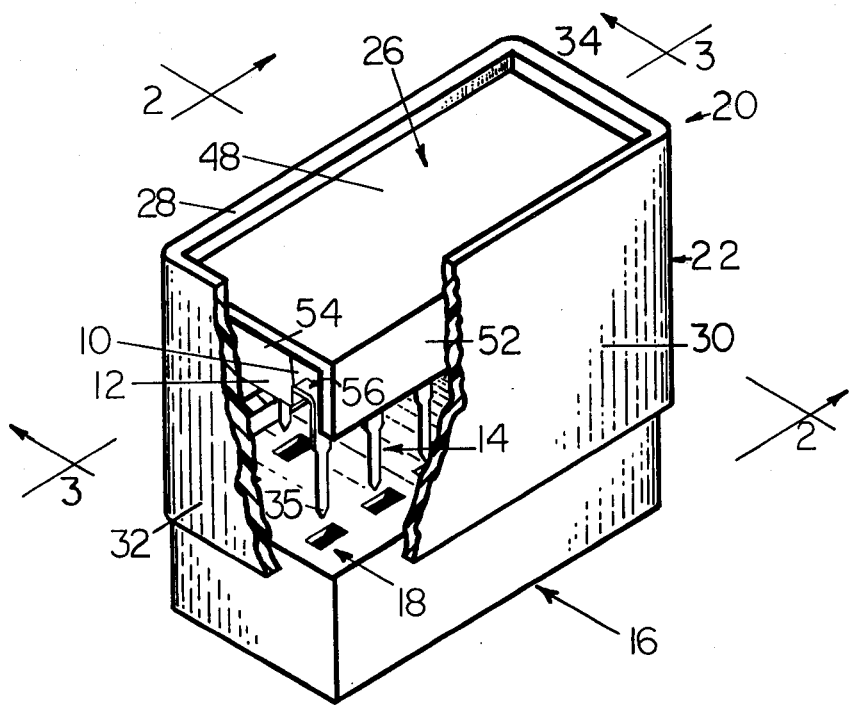
FIG. 1 is a perspective view in partial cutaway of a dual in-line package, a socket, and a socket insertion guide utilizing the present invention.
Figure 2:
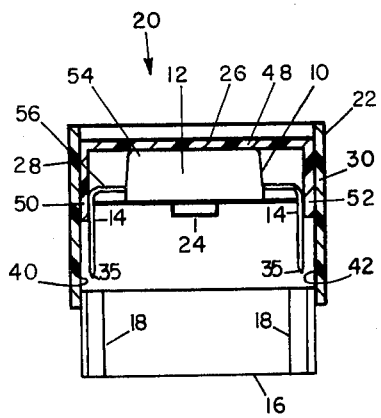
FIG. 2 is a sectional view of the dual in-line package, socket, and socket insertion guide of the present invention taken at 2—2 of FIG. 1.
Figure 3:
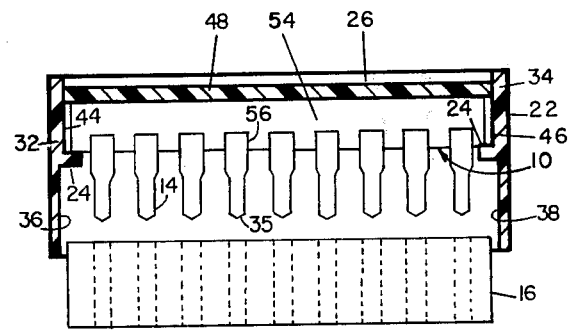
FIG. 3 is a sectional view of the dual in-line package, socket, and socket insertion guide of this invention taken at 3—3 of FIG. 1.

Referring now to the drawings, a dual in-line package or DIP 10 includes both a DIP body 12 and two rows of pins 14, one row of pins on each side of DIP body 12. DIP 10 is designed for insertion into a socket 16. Socket 16 includes two rows of contacts 18, one contact 18 corresponding to each pin 14. To insert DIP 10 into socket 16, each pin 14 must align with its corresponding contact 18 to be properly inserted therein. In order to simplify the views, crosshatching has been eliminated from the sectional views of DIP 10 and socket 16.

A socket insertion guide according to the present invention is referred to generally by reference numeral 20, and includes a housing 22, a pair of stops 24, and a channel 26. Housing 22 is for retaining DIP 10 and receiving socket 16 in an insertion relationship to the DIP. Housing 22 includes two side walls 28 and 30 and two end walls 32 and 34. Placement guides are also formed by side walls 28 and 30 and end walls 32 and 34, the walls extending from beyond the distal ends 35 of pins 14 in one direction to beyond DIP body 12 in the other direction. End walls 32 and 34 act as a pair of longitudinal placement guides, one longitudinal placement guide for each end of the DIP, the inside faces 36 and 38 of the socket end of walls 32 and 34 respectively being the insides of the longitudinal placement guides. The distance between inside face 36 of end wall 32 and inside face 38 of end wall 34 is sufficient to allow the length of socket 16 to be inserted therebetween and not substantially greater than the length of socket 16 plus the socket length dimension of a contact 18 minus the socket length dimension of a pin 14. Similarly, the inside faces 40 and 42 of side walls 28 and 30 respectively are an embodiment of a pair of lateral placement guides. The distance between inside faces 40 and 42 is sufficient to allow the width of socket 16 to be inserted therebetween and not substantially greater than the width of socket 16 plus the socket width dimension of a contact 18 minus the socket width dimension of a pin 14. It can thus be seen that when socket 16 is received into housing 22, two side walls 28 and 30 and two end walls 32 and 34 align pins 14 of DIP 10 with socket contacts 18.

Stops 24, one stop extending from the inside face of each end wall, are for fixing the position of DIP 10 with respect to housing 22 in the direction of insertion of pins 14 into socket contacts 18. An interference fit exists between ends 44 and 46 of DIP body 12 and end walls 32 and 34 respectively.

Channel 26 is placed into housing 22 once DIP 10 is in place. Channel 26 includes a web 48 and flanges 50 and 52. Web 48 fits over the top 54 of DIP 10. Flanges 50 and 52 form an interference fit with side walls 28 and 30 respectively. Each flange extends across the proximal ends 56 of pins 14 on one side of DIP 10. The pressure of flanges 50 and 52 exerted across the proximal ends 56 of pins 14 align the proximal ends of the pins on each side of DIP 10 and orient the proximal ends of the pins for proper insertion of the distal ends 35 of the pins into socket contacts 18. Channel 26 is thus one means for orienting the proximal ends of the pins for proper insertion of the distal ends of the pins into the socket contacts.

In a preferred embodiment of a socket insertion guide according to the present invention, housing 22 and stops 24 are of a unitary construction, and the housing, stops, and channel are all constructed of a thermoplastic material. It can now be seen that since the housing walls extend beyond the distal ends of the pins, that socket 16 is aligned with DIP 10 before pins 14 make contact with contacts 18 when inserting DIP 10. Further, the housing walls assist in removing the DIP in a direction that prevents damaging the pins. In one embodiment, the walls include inner surfaces to match any "keying" of the socket so that the DIP cannot be inserted backwards.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. A socket insertion guide for an encapsulated electronics package having pins oriented to be inserted into socket contacts in substantially a single direction, comprising in combination:
    a housing for retaining the encapsulated electronics package for the useful life of the package;
    a pair of longitudinal placement guides, one longitudinal placement guide for each end of the encapsulated electronics package, extending beyond the distal ends of the pins, the distance between the insides of the longitudinal placement guides being slightly greater than the length of the socket; and
    a pair of lateral placement guides, one lateral placement guide for each side of the encapsulated electronics package, extending beyond the distal ends of the pins, the distance between the insides of the lateral placement guides being slightly greater than the width of the socket.

2. A socket insertion guide according to claim 1 further comprising a means for orienting the proximal ends of the pins for proper insertion of the distal ends of the pins into the socket contacts.

3. A socket insertion guide for a dual in-line package, comprising a housing for retaining the dual in-line package for the useful life of the package and receiving the socket in an insertion relationship to the dual in-line package, the housing having two side walls and two end walls, all extending from beyond the distal ends of the pins of the dual in-line package in one direction to beyond the dual in-line package body in the other direction wherein the two side walls and two end walls align the pins o f the dual in-line package with the socket contacts when the socket is received into the housing.

4. A socket insertion guide according to claim 3, further comprising:
    a pair of stops, one stop extending from the inside face of each end wall for fixing the position of the dual in-line package with respect to the housing in the direction of insertion of the pins into the socket contacts;

wherein an interference fit exists between the ends of the dual in-line package body and the end walls.

5. A socket insertion guide according to claim 4, further comprising a channel for placement in the housing, having a web and flanges, the web fitting over the top of the dual in-line package, and the flanges forming an interference fit with the side walls, each flange extending across the proximal ends of the pins on one side of the dual in-line package thereby aligning the proximal ends of the pins on each side of the dual in-line package.

* * * * *